(12) United States Patent
Saeedi Vahdat et al.

(10) Patent No.: US 11,942,361 B2
(45) Date of Patent: Mar. 26, 2024

(54) SEMICONDUCTOR DEVICE CAVITY FORMATION USING DIRECTIONAL DEPOSITION

(71) Applicant: Applied Materials, Inc., Santa Clara, CA (US)

(72) Inventors: Armin Saeedi Vahdat, Burlington, MA (US); Tristan Y. Ma, Lexington, MA (US); Johannes M. van Meer, Middleton, MA (US); John Hautala, Beverly, MA (US); Naushad K. Variam, Marblehead, MA (US)

(73) Assignee: Applied Materials, Inc., Santa Clara, CA (US)

( * ) Notice: Subject to any disclaimer, the term of this patent is extended or adjusted under 35 U.S.C. 154(b) by 248 days.

(21) Appl. No.: 17/348,093

(22) Filed: Jun. 15, 2021

(65) Prior Publication Data

US 2022/0399225 A1 Dec. 15, 2022

(51) Int. Cl.
*H01L 21/768* (2006.01)
*H01L 21/02* (2006.01)
*H01L 21/764* (2006.01)

(52) U.S. Cl.
CPC ...... *H01L 21/7682* (2013.01); *H01L 21/0226* (2013.01); *H01L 21/764* (2013.01)

(58) Field of Classification Search
None
See application file for complete search history.

(56) References Cited

U.S. PATENT DOCUMENTS 9,997,351 B2 * 6/2018 Chen ............... H01L 21/02274

* cited by examiner

*Primary Examiner* — Jack S Chen
(74) *Attorney, Agent, or Firm* — KDW Firm PLLC

(57) ABSTRACT

Disclosed are approaches for forming semiconductor device cavities using directional dielectric deposition. One method may include providing a plurality of semiconductor structures and a plurality of trenches of a semiconductor device, and forming a dielectric atop the plurality of semiconductor structures by delivering a dielectric material at a non-zero angle of inclination relative to a normal extending perpendicular from a top surface of the plurality of semiconductor structures. The dielectric may be further formed by delivering the dielectric material at a second non-zero angle of inclination relative to the normal extending perpendicular from the top surface of the plurality of semiconductor structures.

15 Claims, 4 Drawing Sheets

300

```
┌─────────────────────────────────────────────┐
│ PROVIDING A PLURALITY OF SEMICONDUCTOR       │
│ STRUCTURES AND A PLURALITY OF TRENCHES       │
│ OF A SEMICONDUCTOR DEVICE                    │
│ 301                                          │
└─────────────────────────────────────────────┘
                      ↓
┌─────────────────────────────────────────────┐
│ DELIVERING A DIELECTRIC MATERIAL AT A        │
│ NON-ZERO ANGLE OF INCLINATION RELATIVE TO    │
│ A NORMAL EXTENDING PERPENDICULAR FROM A      │
│ TOP SURFACE OF THE PLURALITY OF              │
│ SEMICONDUCTOR STRUCTURES                     │
│ 302                                          │
└─────────────────────────────────────────────┘
                      ↓
┌─────────────────────────────────────────────┐
│ DELIVERING THE DIELECTRIC MATERIAL AT A      │
│ SECOND NON-ZERO ANGLE OF INCLINATION         │
│ RELATIVE TO THE NORMAL EXTENDING             │
│ PERPENDICULAR FROM THE TOP SURFACE OF        │
│ THE PLURALITY OF SEMICONDUCTOR STRUCTURES    │
│ 303                                          │
└─────────────────────────────────────────────┘
```

FIG. 5

SEMICONDUCTOR DEVICE CAVITY FORMATION USING DIRECTIONAL DEPOSITION

FIELD

Embodiments of the present disclosure generally relate to substrate processing equipment and techniques, and more particularly, to methods for forming semiconductor device cavities using directional deposition.

BACKGROUND

Air gaps may be used both in back end of line (BEOL) processing or front end of line (FEOL) processing. Two examples of applications for air gaps include air gaps in metallization, such as Cu metallization, and air gaps in NAND memories. However, air gaps created with a low quality dielectric deposition may result in partial and/or non-uniform airgaps.

It is with respect to these and other considerations that the present disclosure is provided.

SUMMARY OF THE DISCLOSURE

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In some approaches, a method may include providing a plurality of semiconductor structures and a plurality of trenches of a semiconductor device, and forming a dielectric atop the plurality of semiconductor structures by delivering a dielectric material at a non-zero angle of inclination relative to a normal extending perpendicular from a top surface of the plurality of semiconductor structures. The dielectric may be further formed by delivering the dielectric material at a second non-zero angle of inclination relative to the normal extending perpendicular from the top surface of the plurality of semiconductor structures.

In some approaches, a method of forming a semiconductor device may include providing a plurality of vertical structures and a plurality of trenches, and forming a first portion of a dielectric bridge by delivering a dielectric material at a non-zero angle of inclination relative to a normal extending perpendicular from a top surface of the plurality of vertical structures, wherein the dielectric bridge extends over at least one trench of the plurality of trenches. The method may further include forming a second portion of the dielectric bridge by delivering the dielectric material at a second non-zero angle of inclination relative to the normal extending perpendicular from the top surface of the plurality of vertical structures, wherein the second portion of the dielectric bridge is connected to the first portion of the dielectric bridge.

In some approaches, a method of forming a semiconductor device may include providing a plurality of vertical structures and a plurality of trenches, and forming a first portion of a dielectric bridge by delivering a dielectric material at a non-zero angle of inclination relative to a normal extending perpendicular from a top surface of the plurality of vertical structures, wherein the dielectric bridge extends over at least one trench of the plurality of trenches. The method may further include forming a second portion of the dielectric bridge by delivering the dielectric material at a second non-zero angle of inclination relative to the normal extending perpendicular from the top surface of the plurality of vertical structures, wherein the second portion of the dielectric bridge is connected to the first portion of the dielectric bridge, and wherein the dielectric bridge partially defines a cavity within the at least one trench of the plurality of trenches.

BRIEF DESCRIPTION OF THE DRAWINGS

By way of example, embodiments of the disclosure will now be described, with reference to the accompanying drawings, in which:

FIG. 5 is a process flow demonstrating a method in accordance with embodiments of the present disclosure.

Figure 1:
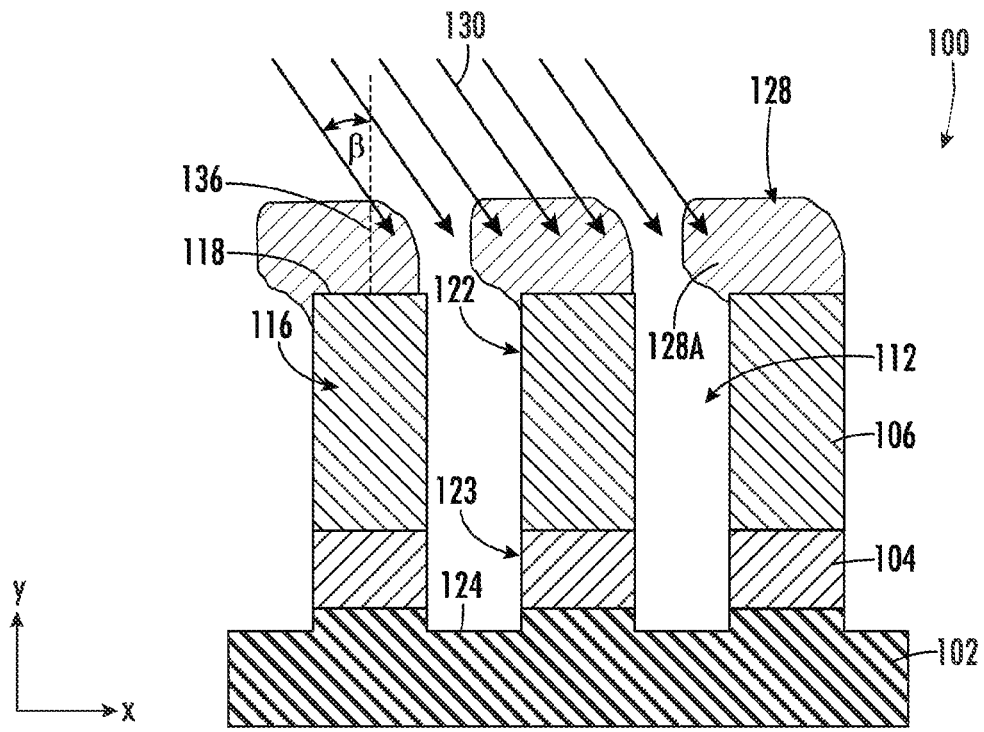
FIG. 1 depicts a side cross-sectional view of an exemplary structure during formation of a dielectric atop a plurality of device structures, in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, devices, structures, and systems in accordance with the present disclosure will now be described more fully hereinafter with reference to the accompanying drawings, where embodiments are shown. The methods, devices, structures, and systems may be embodied in many different forms and are not to be construed as being limited to the embodiments set forth herein. Instead, these embodiments are provided so the disclosure will be thorough and complete, and will fully convey the scope of the methods, devices, structures, and systems to those skilled in the art.

Embodiments described herein generally relate to improved techniques for forming cavities or airgaps in semiconductor devices. More specifically, embodiments described may relate to forming high-quality airgaps for BEOL bitlines in 3D NANDs using a directional deposition process, such as a directional chemical vapor deposition (CVD). In some approaches, a first portion of a dielectric bridge may be formed over a plurality of vertical structures by delivering a dielectric material at a non-zero angle of inclination relative to a normal extending perpendicular from a top surface of the plurality of vertical structures, and forming a second portion of the dielectric bridge by delivering the dielectric material at a second non-zero angle of inclination relative to the normal. The second portion of the dielectric bridge may connect with the first portion of the dielectric bridge to enclose a cavity (i.e., airgap) formed within at least one trench defined by the plurality of vertical structures. In some embodiments, the cavity may extend above the top surface of the plurality of vertical structures.

The multi-part deposition process of the present disclosure advantageously ensures that no deposition occurs in the lower part of trench, resulting in wider cavities and less capacitance within the device. By reducing capacitance, time to program (tprog) speed may be improved. This deposition approach is also less sensitive to incoming structural variation, such as imbalance. Unlike low-quality oxide deposition processes of the prior art, the deposition approach of the present disclosure is capable of creating wider and more consistent cavities for a variety of different metal line heights.

FIG. 1 demonstrates a semiconductor device or structure 100, such as a 3D NAND structure, according to embodiments of the disclosure. In other embodiments, the structure 100 may be a logic device, DRAM, or other type of semiconductor device. As shown, the structure 100 may include a stack of layers, such as a base layer 102, a nitride layer 104 formed over the base layer 102, and a metal layer 106 formed over the nitride layer 104. In other embodiments, the stack of layers may be composed of different sequences of layers and materials. In various embodiments, the stack of layers of the structure 100 can be deposited using any suitable deposition processes and/or apparatus, examples of which can include a chemical vapor deposition (CVD) apparatus, a physical vapor deposition (PVD) apparatus, or an atomic layer deposition (ALD) apparatus.

In some embodiments, the metal layer 106 may be formed using any suitable conductive material (e.g., metal, metal nitride, or a conductive metal compound) such as tungsten (W), molybdenum (Mo), tantalum (Ta), niobium (Nb), osmium (Os), zirconium (Zr), iridium (Jr), rhenium (Re), titanium (Ti), Ti nitride (N), TaN, WN, MoN, ZrN, $WO_x$, $RuO_x$, $IrO_x$, etc. The metal layer 106 may be provided to facilitate forming (or building) memory cell layers on the substrate. The metal layer 106 may correspond to one or more wordlines of the structure 100, wherein each wordline may extend into the page to form additional memory cells that are not visible.

As shown, the structure 100 may include a plurality of trenches 112 formed (e.g., etched) through the stack of layers to form a plurality of vertical structures 116. The trenches 112 may include an upper section 122, a lower section 123, and a base surface 124. Any suitable etching apparatus and/or method may be employed to form the trenches 112, such as deep reactive-ion etching (DRIE), a highly anisotropic etch process employed to create high aspect-ratio holes and trenches in wafers or other substrates. Etching gases suitable for such etching processes can include fluoride ($SF_6$, $CF_4$, $CHF_4$, $CH_3F$, $C_2F_6$, $C_4F_8$, and $NF_3$), chloride (HCl, $Cl_2$, $BCl_3$), bromide ($Br_2$, HBr), or, an oxygen containing gas (e.g., $O_3$, $O_2$, $CO_2$, CO, $H_2O$, NO, $NO_2$, $N_2O$, CO, and the like) and optionally may include an inert gas, such as argon (Ar) or helium (He). Embodiments are not limited in this context.

As further shown, a first deposition process 130 may be performed to form a dielectric material 128 atop the vertical structures 116. The first deposition process 130 may include delivering radicals to the vertical structures 116 at a first non-zero angle of inclination 'β' relative to a vertical 136 extending from a top surface 118 of the vertical structures 116. As shown, a first portion 128A of the dielectric material 128 is formed primarily along the top surface 118 of the vertical structures 116 without significantly filling the trenches 112 with the dielectric material 128. The first portion 128A of the dielectric material 128 may extend partially over the entrance to the trenches 112.

Figure 2:
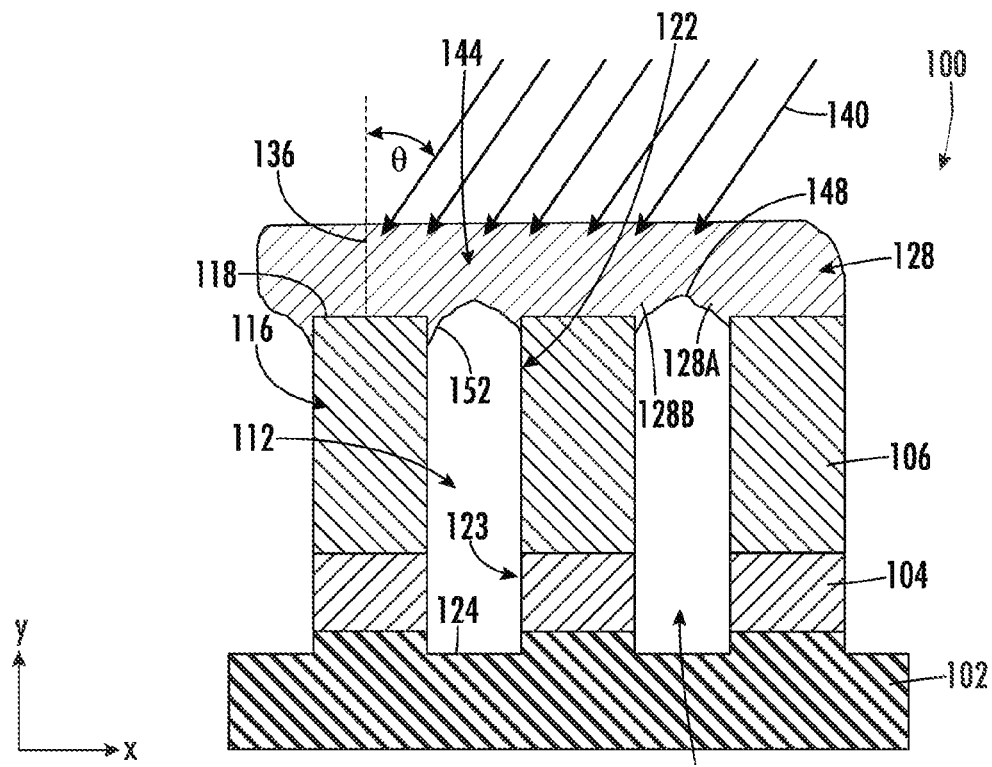
FIG. 2 depicts a side cross-sectional view of the structure during formation of the dielectric atop the plurality of device structures, in accordance with embodiments of the present disclosure.

As shown in FIG. 2, a second deposition process 140 may be performed to continue forming the dielectric material 128 atop the vertical structures 116. The second deposition process 140 may include delivering radicals to the vertical structures 116 at a second non-zero angle of inclination 'θ' relative to the vertical 136 extending from the top surface 118 of the vertical structures 116. As shown, a second portion 128B of the dielectric material 128 is formed primarily along the top surface 118 of the vertical structures 116 without significantly filling the trenches 112 with the dielectric material 128. The second portion 128B of the dielectric material 128 may extend partially over the entrance to the trenches 112 until it connects with the first portion 128A of the dielectric material 128.

The first and second portions 128A, 128B of the dielectric material 128 may form a dielectric bridge 144 extending across one or more of the trenches 112. As shown, the dielectric bridges 144 enclose the trenches 112, forming an airgap or cavity 145 between the sidewalls of the trenches 112 and the dielectric bridge 144. Although not limited to any particular shape, the dielectric bridges 144 may have a curved or arced bottom surface 152. In exemplary embodiments, a crest or tip 148 of the cavity 145 may extend above the top surface 118 of the vertical structures 116. Stated another way, a height of the cavity 145, along the y-axis, may be greater than a height of the vertical structures 116.

In various embodiments, the first angle of inclination β of the first deposition process 130 and the second angle of inclination θ of the second deposition process 140 may vary so the dielectric material 128 impacts more or less of the trenches 112. In some embodiments, the structure 100 may be rotated between the successive deposits so all intended areas of the vertical structures 116 are impacted.

Figure 3:
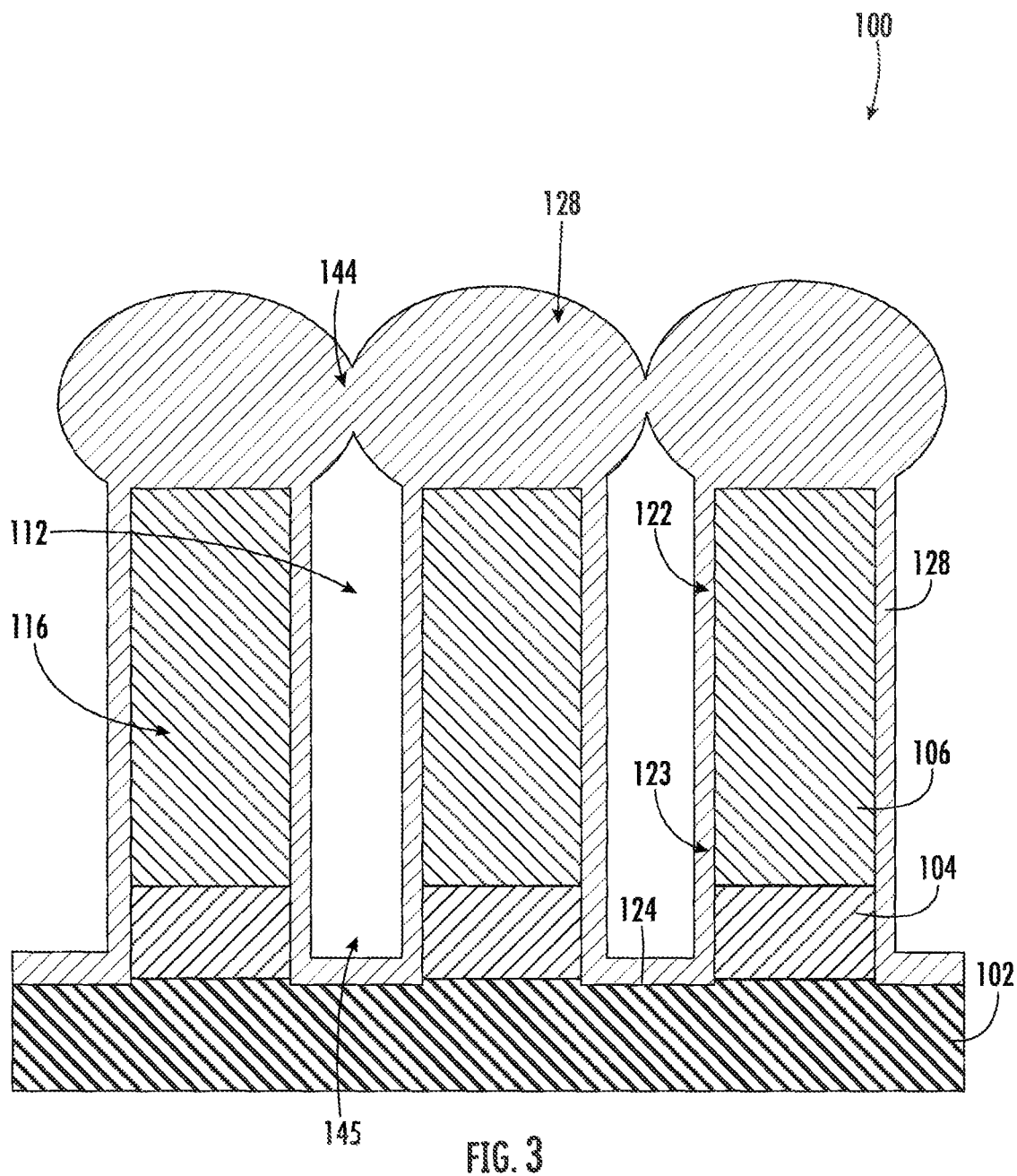
FIG. 3 depicts a side cross-sectional view of the structure following formation of a second dielectric over the plurality of device structures, in accordance with embodiments of the present disclosure.

In some embodiments, as shown in FIG. 3, the dielectric material 128 may be formed within the trenches 112, e.g., along the upper section 122, the lower section 123, and the base surface 124. However, the cavity 145 remains within each of the trenches 112.

Figure 4:
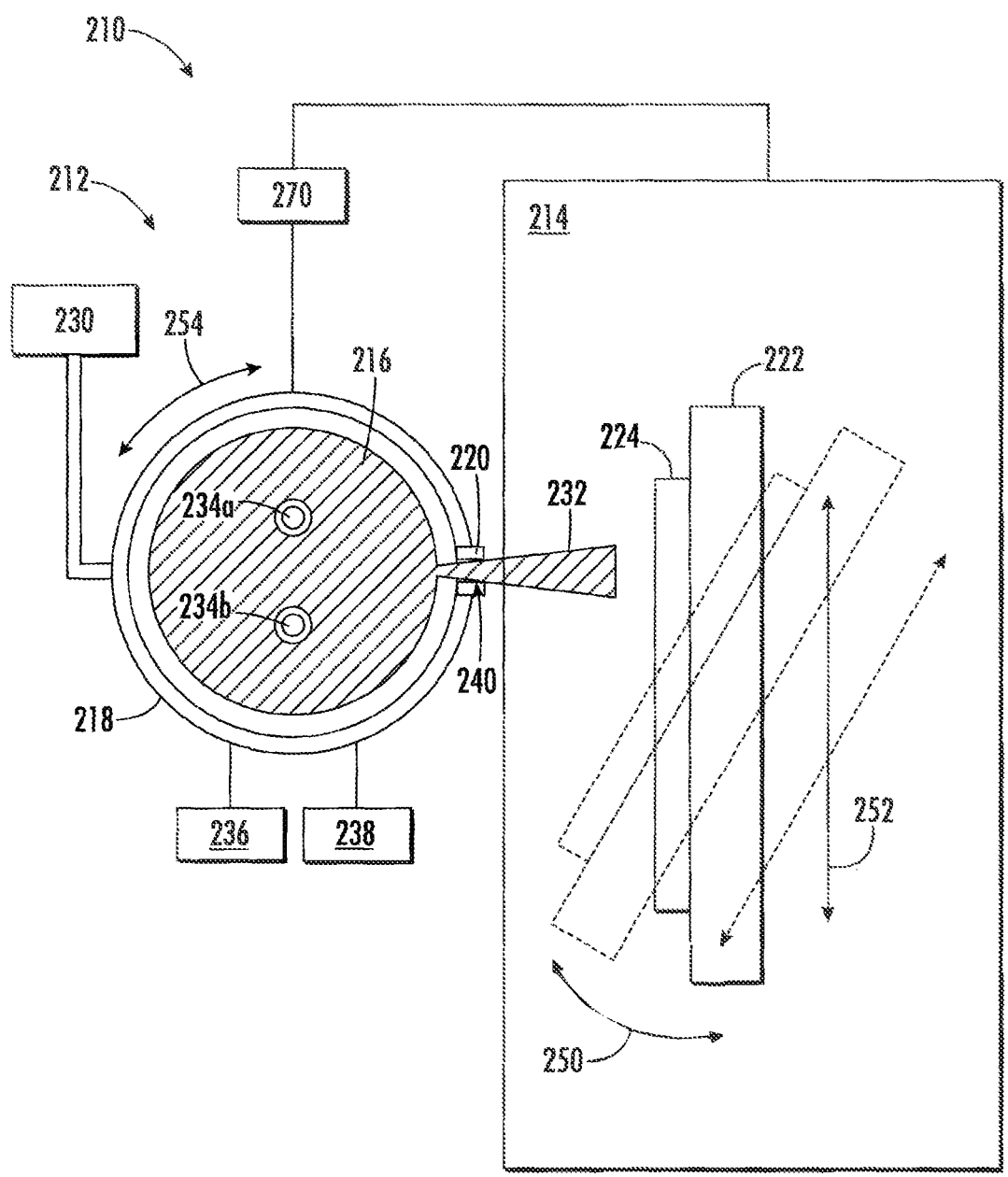
FIG. 4 is a schematic diagram of a system for forming the dielectric over the structure, in accordance with embodiments of the present disclosure.

FIG. 4 illustrates a portion of a system 210 useful to perform processes described herein, such as the first and second deposition processes 130, 140. The system 210 may generally include a plasma source 212 disposed adjacent a process chamber 214. The plasma source 212 may be adapted to generate an energetic plasma 216 in a plasma chamber 218, and to emit the plasma 216, e.g., through a nozzle 220 of the plasma chamber 218, or alternatively with a second plate with a separate aperture situated a specific distance away from 218. While the plasma chamber 218 is depicted as being generally cylindrical in shape, the present disclosure is not limited in this regard, and the plasma chamber 218 may be implemented in a variety of alterative shapes and configurations.

The process chamber 214 may contain a platen 222 adapted to support a substrate 224 (e.g., a silicon wafer) in a confronting relationship with the nozzle 220 of the plasma chamber 218. In various embodiments, the platen 222 may be adapted to forcibly retain the substrate 224, such as via electrostatic clamping or mechanical clamping. Additionally, the platen 222 may include a heating element (not shown) for controllably heating the substrate 224 to a desired temperature (e.g., a temperature in a range between room temperature and 450 degrees Celsius) to enhance deposition processes.

The plasma source 212 of the system 210 may be configured to generate the plasma 216 from a gaseous species supplied to the plasma chamber 218 by one or more gas sources 230. The gaseous species may include one or more of SiH4, CH4, NH3, O2, N2, SiCl4, GeH4, Ar, WF6, etc. The present disclosure is not limited in this regard. The plasma 216 (and particularly free radicals within the plasma) may be projected through the nozzle 220 in the form of a ribbon beam 232 directed at the substrate 224 as further described below. In various embodiments, the plasma source 212 may be a radio frequency (RF) plasma source (e.g., an inductively-coupled plasma (ICP) source, a capacitively coupled plasma (CCP) source, a helicon source, an electron cyclotron resonance (ECR) source, etc.). For example, the plasma source 212 may include electrodes 234a, 234b, an RF generator 236, and an RF matching network 238 for igniting and sustaining the plasma 216 in a manner familiar to those of ordinary skill in the art. The present disclosure is not limited in this regard.

The plasma 216 generated in the plasma chamber 218 may contain ionized gas species (ions), electrons, excited neutrals, and free radicals. In conventional plasma enhanced chemical vapor deposition (PECVD) systems, a substrate is located in the same chamber as a plasma, and free radicals within the plasma are distributed over the surface of the substrate in a directionally-nonspecific, isotropic manner to form a thin film of generally uniform thickness on the exposed surface(s) of the substrate. By contrast, the plasma chamber 218 of the system 210 is separate from the process chamber 214 where the platen 222 and the substrate 224 reside, and a collimated ribbon beam 232 containing free radicals of the plasma 216 is extracted from the plasma chamber 218 and is directed at the substrate 224 in a directionally-specific, anisotropic manner. This is achieved by establishing a pressure differential between the plasma chamber 218 and the process chamber 214, and by collimating the radical beam. In a non-limiting example, the radical beam may be extracted through a nozzle 220 or a second aperture plate having an elongated profile. With regard to the pressure differential, the process chamber 214 may be maintained at a first pressure, and the plasma chamber 218 may be maintained at a second pressure higher than the first pressure. In various examples, the first pressure in the process chamber may be in a range of $10^{-6}$ torr to $10^{-2}$ torr, and the second pressure in the plasma chamber 218 may be in a range of 1 millitorr to 1 torr. The present disclosure is not limited in this regard. Thus, the pressure differential between the plasma chamber 218 and the process chamber 214 may provide a motive force for driving free radicals in the plasma 216 from the plasma chamber 218 into the process chamber 214 in the form of a ribbon beam 232.

The ribbon beam 232 may be given its shape and may be collimated using various structures, devices, and techniques. In one example, the ribbon beam 232 may be given its shape and may be collimated by the elongated, low-profile nozzle 220 of the plasma chamber 218 or alternatively with a second plate set a specific distance away from 218 with a second aperture slot.

The platen 222 may be rotatable and movable for pivoting and scanning the substrate 224 relative to the plasma chamber 218 as indicated by arrows 250 and 252. Additionally or alternatively, the plasma chamber 218 may be rotatable about its long axis as indicated by the arrow 254. Thus, the collimated, free radical-containing ribbon beam 232 may be projected onto the substrate 224 at various oblique angles in a highly directional, anisotropic manner to deposit films on specific sides and/or portions of surface features (e.g., trenches, fins, etc.) of the substrate 224 while keeping other sides and/or portions of such surface features free of such depositions. In a non-limiting example, the movement and/or rotation of the platen 222 and/or the plasma chamber 218 may facilitate projecting the ribbon beam 232 onto the substrate 224 at angles in a range of 30 degrees to 80 degrees relative to a surface of the platen 222 with angle spreads in a range of +/−5 degrees to +/−30 degrees.

Turning now to FIG. 5, a process 300 according to embodiments of the present disclosure is shown. At block 301, the process 300 may include providing a plurality of semiconductor structures and a plurality of trenches of a semiconductor device. In some embodiments, the trenches are formed by etching a metal layer and a nitride layer of a stack of layers.

At block 302, the process 300 may include forming a dielectric atop the plurality of semiconductor structures by delivering a dielectric material at a non-zero angle of inclination relative to a normal extending perpendicular from a top surface of the plurality of semiconductor structures. In some embodiments, the dielectric is formed along a top surface of the semiconductor structures without significant formation along a lower portion of the trenches.

At block 303, the process 300 may include delivering the dielectric material at a second non-zero angle of inclination relative to the normal extending perpendicular from the top surface of the plurality of semiconductor structures. In some embodiments, a first portion of the dielectric material from the first deposition process connects with a second portion of the dielectric material from the second deposition process to form a dielectric bridge extending over one or more of the trenches. In some embodiments, a cavity or airgap is formed beneath the dielectric bridge at the end of the multi-part deposition process.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the layers of the structure 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
    providing a plurality of semiconductor structures and a plurality of trenches of a semiconductor device;
    forming a dielectric atop the plurality of semiconductor structures by:
        delivering a dielectric material at a non-zero angle of inclination relative to a normal extending perpendicular from a top surface of the plurality of semiconductor structures; and
        delivering the dielectric material at a second non-zero angle of inclination relative to the normal extending perpendicular from the top surface of the plurality of semiconductor structures, wherein the dielectric material forms a dielectric bridge extending over a cavity within at least one trench of the plurality of trenches.

2. The method of claim 1, wherein forming the dielectric atop the plurality of semiconductor structures comprises forming the dielectric along the top surface of the plurality of semiconductor structures without entirely filling each of the plurality of trenches with the dielectric material.

3. The method of claim 1, further comprising forming the cavity to extend above the top surface of the plurality of semiconductor structures.

4. The method of claim 1, further comprising providing the plurality of semiconductor structures atop a base layer, wherein at least two semiconductor structures of the plurality of semiconductor structures are metal lines.

5. The method of claim 1, wherein providing the plurality of semiconductor structures comprises forming a tungsten layer over a nitride layer, and wherein the plurality of trenches are formed through the tungsten layer and the nitride layer.

6. A method of forming a semiconductor device, the method comprising:
    providing a plurality of vertical structures and a plurality of trenches;
    forming a first portion of a dielectric bridge by delivering a dielectric material at a non-zero angle of inclination relative to a normal extending perpendicular from a top surface of the plurality of vertical structures, wherein the dielectric bridge extends over at least one trench of the plurality of trenches; and
    forming a second portion of the dielectric bridge by delivering the dielectric material at a second non-zero angle of inclination relative to the normal extending perpendicular from the top surface of the plurality of vertical structures, wherein the second portion of the dielectric bridge is connected to the first portion of the dielectric bridge, and wherein a cavity is formed beneath the dielectric bridge.

7. The method of claim 6, wherein forming the dielectric bridge over the at least one trench of the plurality of trenches comprises forming the dielectric material along the top surface of the plurality of vertical structures without entirely filling each of the plurality of trenches with the dielectric material.

8. The method of claim 6, wherein the cavity is disposed within the at least one trench of the plurality of trenches.

9. The method of claim 8, further comprising extending the cavity above the top surface of the plurality of vertical structures.

10. The method of claim 6, further comprising providing the plurality of vertical structures atop a base layer, wherein each of the plurality of vertical structures is a metal line.

11. The method of claim 6, wherein providing the plurality of vertical structures comprises forming a tungsten layer over a nitride layer, and wherein the plurality of trenches are formed through the tungsten layer and the nitride layer.

12. The method of claim 6, further comprising forming a second dielectric over the dielectric material and the plurality of vertical structures.

13. A method of forming a semiconductor device, the method comprising:
 providing a plurality of vertical structures and a plurality of trenches;
 forming a first portion of a dielectric bridge by delivering a dielectric material at a first non-zero angle of inclination relative to a normal extending perpendicular from a top surface of the plurality of vertical structures, wherein the dielectric bridge extends over at least one trench of the plurality of trenches; and
 forming a second portion of the dielectric bridge by delivering the dielectric material at a second non-zero angle of inclination relative to the normal extending perpendicular from the top surface of the plurality of vertical structures, wherein the second portion of the dielectric bridge is connected to the first portion of the dielectric bridge, wherein the dielectric bridge partially defines a cavity within the at least one trench of the plurality of trenches, and wherein the cavity is beneath the dielectric bridge.

14. The method of claim 13, wherein delivering the dielectric material at the first non-zero angle of inclination and the second non-zero angle of inclination comprises forming the dielectric material along the top surface of the plurality of vertical structures without entirely filling each of the plurality of trenches with the dielectric material.

15. The method of claim 13, further comprising extending the cavity above the top surface of the plurality of vertical structures.

\* \* \* \* \*